United States Patent [19]

Cave et al.

[11] 4,400,756

[45] Aug. 23, 1983

[54] INDUCTIVE LOAD DRIVER PROTECTION CIRCUITS HAVING MINIMAL POWER DISSIPATION

[75] Inventors: David L. Cave, Tempe, Ariz.; Gary L. Maulding, Palm Bay, Fla.; Howard F. Weber, Scottsdale, Ariz.

[73] Assignee: Motorola, Inc., Schaumburg, Ill.

[21] Appl. No.: 296,674

[22] Filed: Aug. 27, 1981

[51] Int. Cl.³ .............................................. H01H 47/32
[52] U.S. Cl. .................................... 361/152; 361/154
[58] Field of Search ................................ 361/152, 154

[56] References Cited

U.S. PATENT DOCUMENTS 4,293,888  10/1981  McCarty ............................. 361/152

*Primary Examiner*—Harry E. Moose, Jr.
*Attorney, Agent, or Firm*—William E. Koch

[57] ABSTRACT

The self-protecting load driver circuit includes an output transistor having an emitter coupled to a current sensor and a collector adapted to be coupled to the electrical load. A comparator senses the magnitude of a current sensor signal and applies trigger signals to a time delay circuit which is connected between the output of the comparator and the control terminal of a control circuit for the protected transistor. The rise time of the voltage across the current sensor depends on the inductance, for instance, of the load. The time delay circuit enables the control circuit to disable the output transistor for a predetermined time duration in response to the threshold voltage of the comparator being exceeded by the sensor voltage. At other times, the protected transistor is saturated by the control circuit so that power is delivered to the load.

4 Claims, 4 Drawing Figures

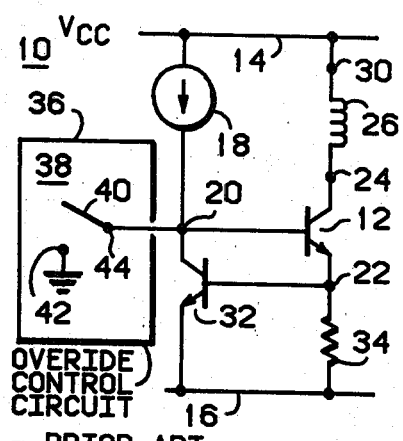
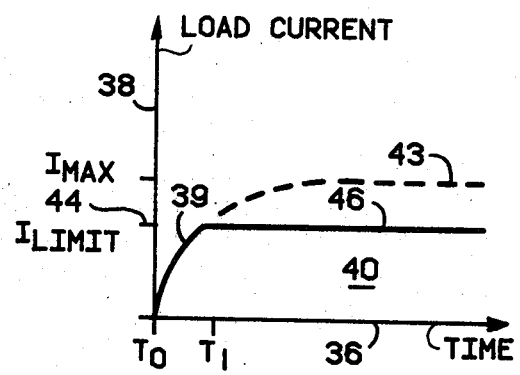
FIG 1 — PRIOR ART
FIG 2
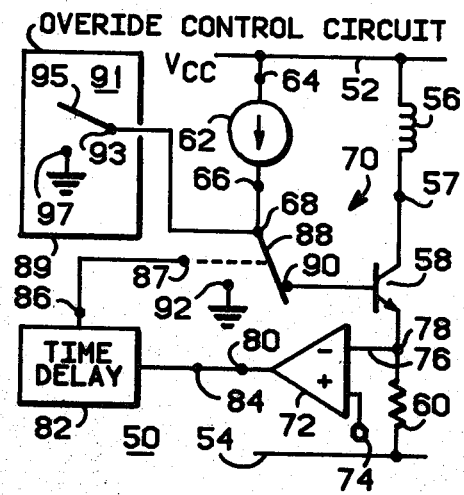
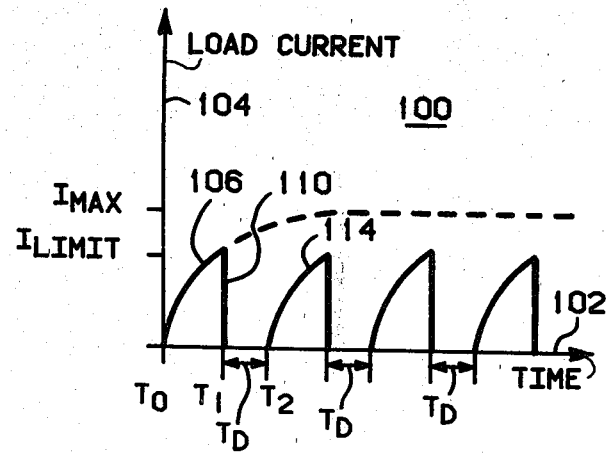
FIG 3
FIG 4

INDUCTIVE LOAD DRIVER PROTECTION CIRCUITS HAVING MINIMAL POWER DISSIPATION

BACKGROUND OF THE INVENTION

This invention relates to current or power limiting circuits and, more particularly, to self-protecting limiting circuits for driving inductive loads, for instance, requiring predetermined average amounts of electrical power.

A variety of solid state, discrete current or power limiting circuits are known in the art for performing various functions. Such circuits generally must deliver at least a minimum amount of power to operate a load but not dissipate more than a maximum amount of power to protect the load or the circuit itself for both. Some of these circuits are complex and others demand the use of expensive discrete power transistors which are required to dissipate large amounts of power under at least some operating conditions. Such power transistors usually must be provided with bulky, expensive heat sinks which keep them within their safe areas of operation.

In many modern applications it is desired that inductive loads, for instance, be driven by monolithic integrated circuits because of cost and reliability considerations. Also, such circuits take up less space and do not weigh as much as corresponding discrete circuits. It is also desirable for such circuits to generate a minimum amount of heat. Since inductive loads often require several amperes of current, driver circuits therefor have traditionally required output power transistors. Unfortunately, it is difficult to build efficient power transistors in monolithic integrated circuit form and it is also difficult to effectively heat sink integrated circuit transistors. Thus, integrated circuits have not traditionally included the final stage load driving devices. A prior art circuit is shown in FIG. 1 and described hereinafter in more detail.

SUMMARY OF THE INVENTION

One object of the present invention is to provide simple, inexpensive circuit configurations which are capable of delivering large amount of average power to electrical loads and which are suitable for being embodied in monolithic integrated circuit form.

Another object of the invention is to provide driver circuits which still energize inductive loads but which have only minimal power dissipation requirements even under current limiting conditions.

A further object of the invention is to provide simple, self-protecting, inexpensive monolithic integrated circuits for delivering large amounts of average current to inductive loads.

Briefly, one embodiment of the invention utilizes a protected, inductive load driver transistor having a main electrode adapted to be connected to the inductive load and another main electrode connected to a current sensor. A comparator circuit is connected between the current sensor and the input terminal of a time delay circuit. A control circuit for the driver transistor includes a control terminal connected to the output terminal of the time delay circuit and an output terminal connected to the control electrode of the driver transistor.

Initially, the control circuit saturates the driver transistor which then completes a circuit path that allows the current through the inductive load to also flow through the current sensor. The inductively controlled rise time of the current through the sensor provides a voltage which triggers the comparator to cause the time delay circuit to enable the control circuit to render the driver transistor nonconductive. The time delay circuit allows the control circuit to again saturate the driver transistor after a predetermined delay. Thus, the driver transistor is operated at either saturation or cutoff to minimize the amount of power dissipated therein.

BRIEF DESCRIPTION OF THE DRAWINGS

FIG. 1 is a partial schematic and block diagram of a prior art current-limited driver circuit for inductive loads;

FIG. 2 is a graph of current versus time illustrating the operation of the circuit of FIG. 1;

FIG. 3 is a partial schematic and block diagram of a power dissipation limited driver circuit for inductive loads of one embodiment of the invention; and FIG. 4 is a graph of current versus time illustrating the operation of the circuit of FIG. 3.

DESCRIPTION OF PRIOR ART

FIG. 1 is a circuit diagram of a prior art current or power limit circuit 10 which requires transistor 12 thereof to dissipate so much power, in some applications, that transistor 12 can not be provided in monolithic form. Thus all or part of circuit 10 must be provided in discrete form. Circuit 10 includes a positive power supply or $V_{cc}$ conductor 14 and a negative or ground power supply conductor 16. Constant current source or supply 18 is connected between positive power supply conductor 14 and node 20.

Protected output transistor 12 includes a base electrode connected to node 20, an emitter electrode connected to node 22, and a collector electrode connected to terminal 24 of inductive load 26. Terminal 30 of inductive load 26 is connected to supply conductor 14. Protecting transistor 32 includes a base electrode connected to node 22, an emitter electrode connected to conductor 16, and a collector electrode connected to node 20. Current sensing resistor 34 is connected between node 22 and conductor 16.

An external, overriding control circuit 36 is connected to node 20. Circuit 36 is shown for purposes of simplification as including a mechanical switch 38 but it can be realized in solid state form in a known manner. Switch 38 has pole 40, a terminal 42 which is connected to receive a ground potential and another terminal 44 which is connected to node 20. Switch 38 alternately opens and closes during normal operation. When closed, switch 38 grounds the current from source 18 to render transistor 12 nonconductive.

The operation of circuit 10 with switch 38 open, as shown in FIG. 1, is illustrated by FIG. 2 which includes an abscissa axis 36 for indicating time and an ordinate axis 38 for indicating current. At time $T_0$, source 18 supplies current to node 20 which renders transistor 12 conductive. As a result, current is drawn through inductive load 26 through the collector-to-emitter path of transistor 12. The emitter current of transistor 12 passes through current sensing resistor 34. The magnitude of the current through the series circuit including inductor 26, transistor 12, and resistor 34 increases exponentially according to the time constant set by the inductance of inductor 26 and the resistance of the series path between conductors 14 and 16 which includes inductor 26. Assuming that switch 38 remains in the position shown, sufficient voltage is developed across resistor 34 to render protecting transistor 32 conductive. This exponential increase is shown by portion 39 of waveform 40 of FIG. 2. The magnitude of the current through the coil 26 would continue to increase until it reached the value of $I_{MAX}$ depicted on ordinate axis 38 as indicated by dashed line 43 if transistor 32 was not included in the circuit. The magnitude of the $I_{MAX}$ current level is determined by the magnitude of the voltage $V_{cc}$ divided by a quantity equal to the resistance of inductor 26 plus the saturation resistance of transistor 12 plus the magnitude of the resistance of resistor 34.

At time $T_1$ the current through resistor 34 reaches a magnitude $I_{LIMIT}$ depicted by point 44. The voltage corresponding to $I_{LIMIT}$ across resistor 34 renders transistor 32 conductive which then shunts a portion of the base drive for transistor 12 which enables transistor 12 to limit the current through coil 26 and resistor 34 to $I_{LIMIT}$.

The power dissipated by transistor 12 is equal to the voltage between its collector and emitter, $V_{ce}$, multiplied by the current $I_c$ therethrough. The voltage across transistor 12 during current limit is equal to $V_{cc}$ minus the voltage across inductor 26 and the voltage across resistor 34. Thus, the voltage across transistor 12 can have a large magnitude. Furthermore, the load current through transistor 12 also can have a large magnitude. Therefore, in such applications transistor 12 is required to be an expensive, discrete power transistor which must be provided with a large, expensive heat sink. Thus, circuit 10 has an undesirable cost and is not suitable for being provided in monolithic integrated circuit form because it is difficult to build and heat sink power transistors in monolithic integrated circuit form. Also, transistor 12 undesirably dissipates what can be an excessive amount of heat when in the current limit mode. This heat can eventually destroy transistor 12.

DETAILED DESCRIPTION OF THE PREFERRED EMBODIMENT

FIG. 3 is a partial block and partial schematic diagram of regulator circuit 50 in accordance with the preferred embodiment of the invention. Circuit 50 can be provided in either discrete or monolithic integrated circuit form. Circuit 50 includes a positive power supply conductor 52 and a negative, or ground, power supply conductor 54. External inductive load 56, the collector-to-emitter path of protected driver transistor 58, and current sense resistor 60 are connected in series between conductors 52 and 54. Constant current source 62 has an input terminal 64 connected to conductor 52 and an output terminal 66 connected to input terminal 68 of switch 70. Switch 70 and current supply 62 form a control circuit for driver transistor 58.

Comparator 72 includes a non-inverting input terminal 74 adapted to receive a reference voltage, $V_{sense}$, an inverting input terminal 76 connected to node 78, and an output terminal 80. The reference voltage can be provided by any one of many circuits known to those skilled in the art. Node 78 is connected between the emitter or one main electrode of transistor 58 and one terminal of current sense resistor 60. Time delay circuit 82 includes an input terminal 84 connected to output terminal 80 of comparator 72 and an output terminal 86 connected to control terminal 87 of switch 70.

Override, external control circuit 89 includes switch 91 which has a terminal 93 connected to node 68, a pole 95 and another terminal 97 which is connected to receive a ground potential. Switch 91 alternately opens and closes during normal operation. When closed, switch 91 grounds the current from source 62 to render transistor 58 nonconductive. The base electrode of output transistor 58 and the ground or reference potential conductor are respectively connected to terminals 90 and 92 of switch 70. Although switches 70 and 91 are diagrammatically shown in mechanical form for purposes of illustration, they can be realized in solid state form in a known manner.

The waveforms of FIG. 4 illustrate the operation of circuit 50 with switch 91 in the open position as shown in FIG. 3. Graph 100 includes an abscissa axis 102 along which time is indicated and an ordinate axis 104 along which current magnitude is indicated. Electrical power is applied to conductors 52 and 54 at time, $T_0$. Initially, time delay circuit 82 normally provides a first control signal at terminal 86 thereof which causes switch 70 to be in the position shown with pole 88 connecting terminal 68 to terminal 90. Consequently, the current from current source 62 renders transistor 58 conductive which then completes the circuit path from conductor 52, through inductor 56, the collector-to-emitter path of transistor 58 and current sense resistor 60 to conductor 54. The magnitude of the current through this path rises exponentially with time as indicated by portion 106 of graph 100 shown in FIG. 4. The magnitude of the current rises exponentially toward the value $I_{MAX}$ designated on the ordinate axis 104. The value of $I_{MAX}$ is determined by the magnitude of the power supply voltage, between conductors 52 and 54, divided by the resistance of inductive load 56, saturation resistance of transistor 58, and the magnitude of the resistance of sense resistor 60. Current supply 62 which can be of known configuration is designed to provide sufficient drive to saturate protected driver transistor 58 when pole 88 is in the initial position in contact with terminal 90. The rise time duration between times $T_0$ and $T_1$ is long enough for sufficient average energy to be applied to load 56 to facilitate the operation thereof, assuming that switch 91 remains in the position shown.

As the magnitude of the current exponentially increases through sense resistor 60, the voltage across the sense resistor also exponentially increases. At time $T_1$, the magnitude of the voltage across sense resistor 60, corresponding to $I_{LIMIT}$ on ordinate axis 104, exceeds the magnitude of the reference voltage applied to terminal 74 of comparator 72. In response to this condition, the level of the voltage at output terminal 80 of comparator 72 abruptly changes to provide a trigger signal. The changed signal level or trigger signal causes the time delay circuit 82 to apply a second control signal to control terminal 87 of switch 70. As a result, pole 88 of switch 70 is activated to make contact with terminal 92 to shunt the drive current for transistor 58 supplied by current source 62 to ground. Consequently, transistor 58 suddenly becomes rendered nonconductive and the current through transistor 58 ceases as indicated by portions 110 of graph 100. Inductive load 56 dissipates its stored energy through a diode (not shown) in a manner known to those skilled in the art.

At time $T_1$, the magnitude of the voltage across resistor 60 rapidly drops to zero passing through the threshold level on terminal 74 thereby causing the output of comparator 72 to change back to its initial level. However, time delay circuit 82, which may be a monostable multivibrator, is responsive to the initial transition of the trigger signal at the output of comparator 80 to provide the second control signal which is applied to control terminal 87 and which continuously holds pole 88 of switch 70 in contact with terminal 92 for a predetermined amount of time, $T_D$, shown along axis 102. $T_D$ is long enough to allow the energy stored in inductive load 56 to dissipate.

At time $T_2$, time delay circuit 82 causes the level of the second control output signal at terminal 86 thereof to change back to its initial or normal magnitude to again provide the first control signal which thereby causes or allows pole 88 of switch 70 to again contact terminal 90. Consequently, the magnitude of the current through inductor 56 again increases in an exponential manner as indicated by portion 114 of graph 100 until $I_{LIMIT}$ is again reached. Thus, circuit 50 operates like a free running multivibrator. Drive current is alternately connected and disconnected to and from protected transistor 58 so that transistor 58 is either saturated or nonconductive. The frequency of operation of circuit 50 depends upon the time constant of the series circuit path including inductive load 56, the threshold voltage on terminal 74, and the time delay of circuit 82. Circuit 50 is useful for driving reactive loads requiring predetermined amounts of average power. Inductive loads such as the stator coils of a brushless motor having a permanent magnet rotor are used in automotive fuel pump drivers. The inductance of these coils is large enough to provide a sufficiently long time constant to enable an adequate amount of average power to be delivered between time $T_0$ and $T_1$. In this application, $I_{LIMIT}$ is approximately 8 amps and the frequency of operation is approximately 1 kilohertz.

What has been described is a circuit 50 which produces minimal power dissipation in power transistor 58 because transistor 58 is operated only in either saturation or cut-off even during the current limit mode of operation. When transistor 58 is saturated, there is very little voltage developed thereacross and when transistor 58 is cut off, there is very little current therethrough. Accordingly, the power dissipated by transistor 58 which is the product of the collector-to-emitter voltage and the emitter current thereof is small. Thus circuit 50 reduces the power dissipation required of protected transistor 58 as compared to circuit 10 thereby enabling transistor 58 to be provided in monolithic integrated form along with the other components of circuit 50 except for inductor 56. Alternatively, transistor 58 could be a smaller, less expensive transistor requiring less heat sinking than transistor 12 for supplying the same average power to an inductive load if provided in discrete form. Monolithic integrated circuits generally have reduced cost and space requirements and increased reliability as compared to corresponding discrete circuits. Circuit 50 has been found to be useful in commercial automotive applications.

We claim:

1. A circuit for limiting current in an inductive load, comprising:
    a transistor having first and second current conducting electrodes and a control electrode, said first current conducting electrode coupled to said load;
    current sensing means coupled between said second current conducting electrode and a first reference voltage, said current sensing means having a sensed voltage;
    comparator means having a first input adapted to receive a bias voltage, a second input coupled to said current sensing means, and an output having a first state representative of said sensed voltage being greater than said bias voltage and a second state representative of said sense voltage being less than said bias voltage;
    control circuit means having a control terminal responsive to said output of said comparator means and having an output coupled to said control electrode for rendering said transistor nonconductive when said output of said comparator means is in said first state and for rendering said transistor conductive when said output of said comparator means is in said second state; and
    time delay means coupled between said output of said comparator means and said control circuit means for disabling said transistor for a predetermined period of time following the transition at said output of said comparator means from said second state to said first state.

2. The circuit of claim 1 wherein said current sensing means includes a resistor means.

3. The circuit of claim 1 wherein said control circuit means comprises:
    current supply means; and
    switch means having an input terminal connected to said current supply means, a first output terminal connected to said control electrode of said transistor, a second output terminal adapted to receive a second reference voltage, and a control terminal coupled to said output terminal of said time delay means.

4. The circuit of claim 1 wherein said transistor comprises an NPN transistor, a collector being the first current conducting electrode, said collector coupled to a third reference voltage by said inductive load, said inductive load controlling the rise time of said sensed voltage.

* * * * *